United States Patent [19]

Halon et al.

[11] 4,370,195

[45] Jan. 25, 1983

[54] REMOVAL OF PLASMA ETCHING RESIDUES

[75] Inventors: Bernard Halon, Brooklyn, N.Y.; John L. Vossen, Jr., Bridgewater, N.J.

[73] Assignee: RCA Corporation, New York, N.Y.

[21] Appl. No.: 362,042

[22] Filed: Mar. 25, 1982

[51] Int. Cl.$^3$ .............................. C23F 1/02; B08B 3/12; B08B 6/00; B08B 7/00

[52] U.S. Cl. ........................................ 156/643; 134/1; 134/30; 156/646; 156/659.1; 156/665; 204/192 E; 252/79.1

[58] Field of Search .................. 134/1, 26, 30, 39; 252/79.1; 156/643, 646, 651, 656, 659.1, 665, 638; 204/192 E, 164; 427/38, 39

[56] References Cited

U.S. PATENT DOCUMENTS

| | | | |
|---|---|---|---|
| 4,243,865 | 1/1981 | Saxena | 156/646 X |
| 4,308,089 | 12/1981 | Iida et al. | 156/646 X |
| 4,325,984 | 4/1982 | Galfo | 156/646 X |

OTHER PUBLICATIONS

Moran et al., *J. Vac. Sci. Technol.*, vol. 19 (4), pp. 1127–1131, Nov./Dec. 1981.
Busta et al., 1977, *I.E.E.E. Inter Electronic Devices Meeting Tech. Digest*, Wash., D.C., pp. 12–15, (1977).
IBM Technical Disclosure Bulletin, vol. 21, No. 6, Nov. 1978, Plasma Removal of Residue Following Reactive Ion Etching of Aluminum and Aluminum Alloys by G. T. Chiu et al., p. 2315.
IBM Technical Disclosure Bulletin, vol. 21, No. 10, Mar. 1979, Cleaning of Permalloy Mask After Exposure to Chlorine Rie System by Zarowin, p. 4237.

*Primary Examiner*—William A. Powell
*Attorney, Agent, or Firm*—Birgit E. Morris; R. Hain Swope

[57] ABSTRACT

An improvement in the etching of aluminum utilizing a carbon-containing etchant gas is provided whereby the residues remaining after etching are treated in a nitrogen glow discharge for a time effective in removing them or rendering them susceptible to removal by conventional means.

5 Claims, No Drawings

REMOVAL OF PLASMA ETCHING RESIDUES

This invention pertains to the plasma etching of aluminum and its alloys. More particularly this invention pertains to a method of removing residues remaining after the plasma etching of aluminum or its alloys.

BACKGROUND OF THE INVENTION

The importance of etching aluminum and its alloys has increased significantly within the last several years due to the inclusion of aluminum in very large scale integrated circuits (VLSI). As the electronics industry has moved into production of VLSI devices, the need for methodology which meets production requirements therefor, e.g. fine-line etching of aluminum, has become increasingly important.

One of the critical problems which must be solved in order that fine-line etching of aluminum can be utilized on a production basis is the residues which remain after etching is completed. There are two sources for such residues: the photoresist and, in certain instances, the etchant gas itself. These residues are very tenacious and have resisted both physical and chemical means of removal. A simple, efficient method of removing these residues is provided in accordance with this invention.

BRIEF SUMMARY OF THE INVENTION

A method of substantially removing residues remaining after the plasma etching of aluminum is provided which comprises subjecting the residues to a glow discharge in nitrogen for a time effective to remove them or substantially remove them, the remainder being easily removable by conventional means.

DETAILED DESCRIPTION OF THE INVENTION

The residues remaining after plasma etching of aluminum are disadvantageous in two ways. First, their presence may prevent good contact or lack of contact where desired in aluminum metalized circuits. Furthermore, the residual layer often absorbs chlorinated species during etching. When the substrate is exposed to air containing moisture, these species react with the water to form acidic compounds, such as hydrochloric acid, which corrode the underlying aluminum. While there are methods of preventing corrosion by these species in the residue, none is effective in removing the residues themselves.

The residues which are treated in accordance with this invention are polymeric in nature. In so far as a resist is concerned, the exact nature of the residue will undoubtedly vary to some degree with the resist being utilized. While the exact nature of these residues is unknown, they have been observed with all resists tested or reported in the literature. This is so for both positive and negative resists although, as a practical matter, only positive resists are utilized in the fine-line plasma etching of aluminum.

The residue remaining where aluminum was exposed to the plasma etch is likewise polymeric although its exact nature is not known. These residues are formed when the etch gas mixture includes one or more carbon-containing gases. For example, a commonly used etch gas mixture for etching of aluminum is carbon tetrachloride and helium. Another mixture utilized to etch aluminum is boron trichloride and trichloromethane (chloroform). The residue formed utilizing these and other similar etching mixtures is thought to be a single, long-chain polymer. This has not been confirmed.

The formation of a residue such as described herein can be avoided by utilizing an etching mixture which has no carbon-containing gases. The conventionally used etching mixture of this type is boron trichloride and chlorine. While this mixture will not produce a residue such as described herein, it is disadvantageous in that it produces significant undercutting of the aluminum under the resist. The loss of resolution resulting from this undercutting is unacceptable for the production of VLSI circuits. While the undercutting with mixtures such as boron trichloride and chlorine can be minimized, this is only achieved by reducing the etch rate to a point where profile control during etching is lost. This is likewise unacceptable from a production viewpoint.

The residues referred to herein, i.e. those resulting from the etching of aluminum with a carbon-containing gas and those resulting from exposure of a resist material to the etching plasma, cannot be removed by conventional procedures for the removal of organic or carbonaceous materials. By conventional procedures is meant the use of various solvents including highly polar organic solvents and/or exposing the surface to an oxygen glow discharge to "ash" or plasma etch the material away by the formation of, e.g. $CO$ and $CO_2$. For example, a residue formed during etching of aluminum with a mixture of carbon tetrachloride and helium was exposed to an oxygen plasma for one hour. The residue was severely pitted, but was not removed.

In order to demonstrate the tenacity of the residues referred to herein, the commercial photoresist HPR-204 manufactured by Hunt Chemical Co. coated onto aluminum was etched with a mixture of carbon tetrachloride and helium. The following solvents, usually effective in removing organic materials, were tried and found ineffective; chloroform, carbon tetrachloride, acetone, benzene, methylene chloride, persulfuric acid, sodium hydroxide, ammonium hydroxide, methyl pyrrolidinone and nitromethane. Utilizing these solvents in conjunction with ultrasonic vibration was likewise ineffective.

In accordance with this invention, there is provided a method of removing residues remaining after plasma etching of aluminum which comprises treating the substrate with a nitrogen glow discharge. The fact that the nitrogen glow discharge treatment in accordance with this invention is effective in removing the herein discussed residues is considered unexpected in view of a paper given by Moran et al. at the 1981 Electron, Ion and Photon Beam Conference at in Dallas, Texas and published in J. Vac. Sci. Technol., Vol. 19, pages 1127-31 (1981). Moran et al. described a similar nitrogen glow discharge carried out in a barrel reactor on various resist materials. They found that the nitrogen glow discharge hardened the resist materials, thus rendering them flow resistant during heating. They observed no material removal. Moran et al., however, only exposed the substrates to nitrogen glow discharge for a short period of time, i.e. about 10 minutes. It is surprising in view of the results obtained by Moran et al. that an extended nitrogen glow discharge is effective in removing the residues remaining after the plasma etching of aluminum. By extended is meant a period of at least 40 minutes, preferably from about 40 to about 60 minutes under conditions similar to those described by Moran et al., i.e., a barrel reactor, 350–400 watts of power and a pressure of 1 Torr.

The mechanism by which the nitrogen glow discharge of this invention removes residues remaining after the plasma etching of aluminum is not known. It is considered probable, however, that the nitrogen breaks the polymeric chain to form volatile products and/or smaller segments which can be removed by physical bombardment. The method of this invention, however, does not always totally remove the unwanted residues. In those instances where the residues are not totally removed, they become susceptible to removal by conventional procedures which were ineffective before the nitrogen glow discharge, i.e. oxygen plasma or wet chemical techniques.

Regardless of whether or not the nitrogen glow discharge treatment of this invention totally removes the residues, it has been found in all instances tested that there is produced one or more volatile products. Such products are detectable by, for example, an ellipsometric-photometric end point detection technique as described by Busta et al. in a paper in the 1977 IEEE Inter Electronics Devices Meeting Technical Digest at pages 12 through 15. By the use of such techniques, the end point of the subject method may be detected.

The term "end point" as applied to the method of this invention is defined as that point where there is no longer a detectable volatile product. Nitrogen glow discharge is continued until the end point is reached, after which the substrate is examined to determine if the residues have been completely removed. If not, the remainder can be easily disposed of by conventional wet chemical techniques or by oxygen glow discharge.

The end point, which may also be detected visually in those instances where removal of the residues is complete, is reached in accordance with this invention in from about 40 to about 60 minutes. This period is under conventional conditions for nitrogen glow discharge, for example: 1 KW power and 150 mtorr in a plasma reactor; 350–400 watts and 1 torr. pressure in a barrel reactor; and the like. The time of nitrogen glow discharge may further vary with the particular equipment utilized and variations in the power input or pressure. These adjustments are considered to be well within the knowledge of one of ordinary skill in the art. The nitrogen glow discharge may immediately follow the aluminum etching by simply changing the etchant gas to nitrogen and making necessary adjustments in power and pressure. If desired, the reaction chamber may be vented to the atmosphere before the nitrogen glow discharge is initiated.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

A series of 1 micrometer thick aluminum coated silicon wafers was utilized as substrates. The wafers were overcoated with a finely patterned layer of the positive resist HPR-204 available from Hunt Chemical Co. The wafers were placed in groups of two into a parallel electrode etching reactor. The upper electrode was rf powered and the lower (substrate) electrode was tuned to produce a voltage to ground of 238 volts. The upper electrode power was one KW and the pressure during etching was 250 mtorr. The total gas flow averaged about 60 sccm. Etching was carried out utilizing a 50:50 partial pressure mixture of carbon tetrachloride and helium. Etching was carried out from 5 minutes, well beyond the end point as determined by an end point detector.

A residue was visually noted at the end of the etching run both in the vias and on the unetched aluminum. The etchant gas was changed to ultrapure nitrogen under the same power and 150 mtorr pressure. Etching was continued for 45 minutes. The substrate appeared visually to be free of residue. This was confirmed by microscopic examination.

EXAMPLE 2

A series of wafers was etched in accordance with Example 1 except that the etchant gas was a 50:50 partial pressure of boron trichloride and trichloromethane. The total gas flow averaged 50 sccm. Etching was carried out for 12 minutes, well beyond the end point as determined by the end point detector.

A residue was again visually noted. The substrates were etched with ultrapure nitrogen as in Example 1 for 45 minutes. Groups of five substrates were further treated as follows.

A first group was submerged in pure acetone and subjected to ultrasonic vibrations for 10 minutes.

A second group was subjected to oxygen glow discharge under the same conditions as the nitrogen glow discharge for a period of 10 minutes. Both of these methods removed all traces of residue from the surface.

COMPARATIVE EXAMPLE

A series of wafers each were etched according to the procedure of Example 1. Groups of three wafers each were treated with acetone/ultrasonic and oxygen glow discharge, respectively, as in Example 2 but omitting the nitrogen glow discharge. No discernable change was noted in the residue on any wafer.

We claim:

1. In a process of plasma etching aluminum or an alloy thereof with an etchant gas comprised of at least one carbon-containing gas, wherein etching produces residues which are not susceptible to removal by oxygen plasma or organic solvents, the improvement comprising treating said residues with a nitrogen glow discharge for a time effective to remove the residues or render them susceptible to removal by oxygen plasma or organic solvents.

2. A process in accordance with claim 1, wherein said etchant gas is a mixture of carbon tetrachloride and helium.

3. A process in accordance with claim 1, wherein said etchant gas is a mixture of boron trichloride and trichloromethane.

4. A process in accordance with claim 1, wherein the nitrogen glow discharge is carried out for at least forty minutes.

5. A process in accordance with claim 4, wherein the nitrogen glow discharge is carried out for from about 40 to about 60 minutes.

* * * * *